United States Patent [19]

Imamura

[11] 4,218,661

[45] Aug. 19, 1980

[54] C-MOS CRYSTAL OSCILLATOR INCLUDING CIRCUIT FOR TEMPORARILY INCREASING CLOSED LOOP GAIN

[75] Inventor: Yoichi Imamura, Suwa, Japan

[73] Assignee: Kabushiki Kaisha Suwa Seikosha, Tokyo, Japan

[21] Appl. No.: 853,926

[22] Filed: Nov. 22, 1977

[30] Foreign Application Priority Data

Nov. 22, 1976 [JP] Japan ................................ 51/140361

[51] Int. Cl.² .......................... H03B 5/04; H03B 5/06; H03B 5/36
[52] U.S. Cl. .............................. 331/116 FE; 368/159; 331/186
[58] Field of Search ................... 331/116 R, 186, 185, 331/116 FE; 58/23 A, 23 AC

[56] References Cited

U.S. PATENT DOCUMENTS

4,039,973  8/1977  Yamashiro .......................... 331/116

Primary Examiner—Siegfried H. Grimm

Attorney, Agent, or Firm—Blum, Kaplan, Friedman, Silberman & Beran

[57] ABSTRACT

An oscillator circuit wherein the impedance at the output terminal can be selectively decreased for a short period of time to thereby increase the closed loop gain is provided. The oscillator circuit includes a quartz crystal vibrator and a C-MOS inverter having a drain output terminal for producing a high frequency signal thereat, the gate output terminal being fed back through the quartz crystal vibrator to a gate input terminal to define a predetermined closed loop gain. The invention is particularly characterized by a control circuit external to the oscillator circuit that is adapted to produce a control signal for a predetermined period of time. A secondary inverter is provided and is adapted to be selectively coupled, in parallel, with the C-MOS inverter during the period of time that the control signal is applied thereto, to thereby reduce the impedance at the output terminal of the C-MOS inverter and increase the closed loop gain during the predetermined period of time that the control signal is applied thereto.

17 Claims, 9 Drawing Figures

C-MOS CRYSTAL OSCILLATOR INCLUDING CIRCUIT FOR TEMPORARILY INCREASING CLOSED LOOP GAIN

BACKGROUND OF THE INVENTION

This invention is directed to an improved oscillator circuit, and in particular to an oscillator circuit having a C-MOS inverter and a secondary inverter that is selectively coupled, in parallel, with the C-MOS inverter to reduce the impedance at the output of the C-MOS inverter and thereby increase the closed loop gain of the C-MOS inverter for a short interval of time.

Quartz crystal oscillator circuits, utilizing a quartz crystal vibrator as a high frequency time standard, have become well known in the art. Such quartz crystal vibrator oscillator circuits are able to produce highly stable, high frequency time standard signals and, hence, are particularly suitable for use in electronic timepieces for providing accurate timekeeping.

A quartz crystal oscillator circuit includes a quartz crystal vibrator, a C-MOS inverter having its output fed back through the quartz crystal vibrator to its input, and further feedback resistance elements and capacitor elements that stabilize the operation of the oscillator circuit. Accordingly, the supply voltage required to effect starting, stopping and stable operation of the oscillator circuit depends upon the closed loop gain of the oscillator circuit, which closed loop gain is determined in large measure by the impedance of the resistance and capacitance elements of the oscillator circuit, and the impedance at the output of the C-MOS inverter circuit.

Although it has been found that a reduction of the capacitance at the output of the C-MOS inverter will result in a reduction in the supply voltage necessary to effect oscillation of the circuit or to maintain same oscillating, a reduction in capacitance at the output of the C-MOS inverter often contribute, to less than completely stable operation. Similarly, it has also been found that an increase in the current supplied to the C-MOS inverter will also permit the quartz crystal oscillator circuit to commence operation at lower supply voltages and to continue operating at even lower supply voltages. Nevertheless, an increase in current consumption will rapidly dissipate the voltage source producing the supply voltage, which voltage source is usually a DC battery, when the oscillator circuit is utilized in an electronic wristwatch. Accordingly, an oscillator circuit wherein the supply voltage required to start same oscillating or to keep same oscillating is reduced, when a supply voltage is initially applied thereto, or when during operation the level of the supply voltage applied thereto is reduced, is desired.

SUMMARY OF THE INVENTION

Generally speaking, in accordance with the instant invention, an oscillator circuit that can admit of stable operation and a temporary increase in the closed loop gain in response to a supply voltage being initially applied thereto, or alternatively in response to a sudden decrease in the supply voltage being applied thereto, is provided. The oscillator circuit includes a quartz crystal vibrator and a C-MOS inverter having a drain output terminal for producing a high frequency signal thereat. The drain output terminal is fed back through the quartz crystal vibrator to the drain input terminal to define a predetermined closed loop gain. A control circuit is disposed external to the oscillator circuit for producing a control signal for a predetermined interval of time when, for example, a supply voltage is initially applied to the oscillator circuit, or alternatively, the supply voltage utilized to drive the oscillator circuit suddenly is reduced. A secondary inverter is adapted to be selectively coupled in parallel with the C-MOS inverter during the predetermined period of time that the control signal is applied thereto, to thereby reduce the impedance at the output terminal of the C-MOS inverter. As a result of the reduced impedance at the output of the C-MOS inverter, the closed loop gain of the oscillator circuit will be increased, and thereby permit the oscillator circuit to operate in a stable manner if the supply voltage applied thereto is substantially reduced.

Accordingly, it is an object of this invention to provide an improved quartz crystal vibrator oscillator circuit.

A further object of the instant invention is to provide an oscillator circuit including a C-MOS inverter wherein the impedance at the output terminal thereof can be reduced for short periods of time to thereby increase the closed loop gain.

Another object of the instant invention is to provide an oscillator circuit that can admit of stable operation for short periods of time in response to reductions in the supply voltage applied thereto.

Still a further object of the instant invention is to provide an improved oscillator circuit particularly suitable for use in an electronic wristwatch.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
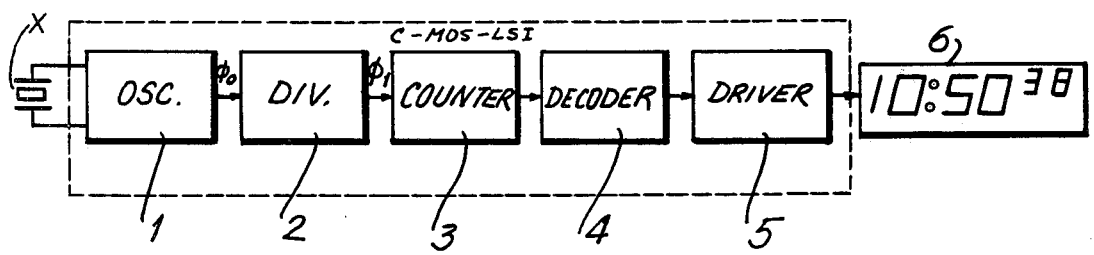
FIG. 1 is a block circuit diagram of an electronic wristwatch constructed in accordance with the prior art.

Reference is first made to FIG. 1, wherein an electronic timepiece, constructed in accordance with the prior art, is depicted. The electronic timepiece includes an oscillator circuit 1 having a quartz crystal vibrator X, as a high frequency time standard, for producing a high frequency time standard signal $\phi_0$. The high frequency time standard signal $\phi_0$ is applied to a divider comprised of a plurality of series-connected divider stages, which divider produces a low frequency timing signal $\phi_1$. The low frequency timing signal $\phi_1$ is applied to a plurality of counters, which counters produce timekeeping signals representative of actual time. The timekeeping signals produced by the counters 3 are applied to a decoder circuit 4 and driver circuit 5, and are thereby displayed by an electro-optical digital display 6 in a conventional manner. The digital display is comprised of liquid crystal digital display elements or light emitting diodes arranged to define seven-segmented display digits. Miniaturization of the electronic timepiece is effected by forming each of the circuits into a C-MOS-LSI integrated circuit chip defined by the dashed lines in FIG. 1. Moreover, each of the circuits including the oscillator circuit, divider circuit, counters, decoders and drivers are formed of C-MOS elements in order to reduce the size of the integrated circuit chip and the current consumption when same is utilized. Reduced current consumption is particularly important when a single battery is utilized as a voltage supply in order to decrease the frequency with which the battery must be replaced.

Figure 2:
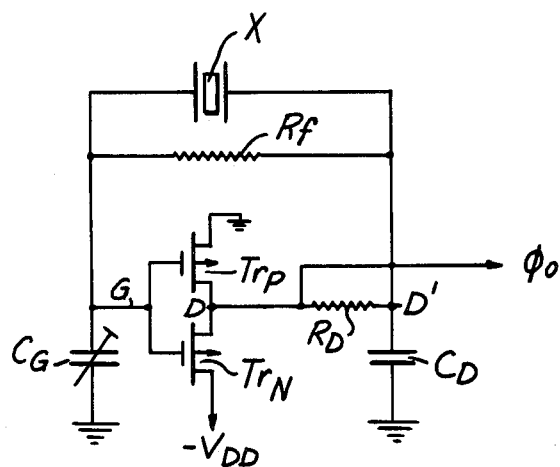
FIG. 2 is a circuit diagram of a quartz crystal oscillator circuit constructed in accordance with the prior art.

It is noted that electronic wristwatches, of the type depicted in FIG. 1, utilize an oscillator circuit of the type depicted in FIG. 2, in order to obtain a highly stable high frequency time standard signal $\phi_0$. Moreover, the operation of the remaining circuits, including the divider, counters, decoders and drivers, are not in any way utilized to control the operation of the oscillator circuit or the high frequency time standard signal produced thereby. It is further noted that the oscillator circuit has many analog elements but occupies less area than the remaining circuits in the electronic wristwatch. Moreover, the analog elements render it difficult to lower the current consumption of the oscillator circuit.

Referring now to FIG. 2, a quartz crystal oscillator including a C-MOS inverter that is constructed in accordance with the prior art is depicted. The C-MOS inverter includes a P-channel transistor $Tr_p$ and an N-channel MOS transistor $Tr_N$ complementary coupled to define a gate output terminal G and a drain output terminal D. A feedback resistor $R_f$ is utilized to feedback the voltage at the drain output terminal D to the gate input terminal G. The feedback resistance is selected in order to maximize the gain of the C-MOS inverter and is within a range of 10 to 50 M$\Omega$ in a conventional oscillator circuit. By selecting a feedback resistance in the range of 10 to 50 M$\Omega$, the feedback resistance has little effect on the attenuation of the circuit or the phase of the high frequency time standard signal produced by the circuit. A resistor $R_D$ can also be provided intermediate the drain output terminal D and the parallel connection of the feedback resistor $R_F$ and the quartz crystal vibrator X in order to suppress frequency shifts that result from changes in the output impedance of the C-MOS inverter resulting from variations in the supply voltage applied to the oscillator circuit, which variations can be on the order of 200 to 500 kV. Capacitors $C_G$ and $C_D$ are coupled intermediate the drain output terminal and gate input terminal, respectively, and a reference potential, such as ground. The gate capacitor $C_G$ and the drain capacitor $C_D$ are required for stabilizing the oscillation of the circuit, for permitting the frequency of the high frequency time standard signal to be adjusted, and for compensating for temperature variations of the quartz crystal vibrator. The battery, utilized as a voltage supply, supplies a DC voltage $-V_{DD}$ to the source electrode of the N-channel transistor $Tr_N$ and is utilized, not only to drive the oscillator circuit but, additionally, all of the remaining circuits of the electronic wristwatch.

Figure 3:
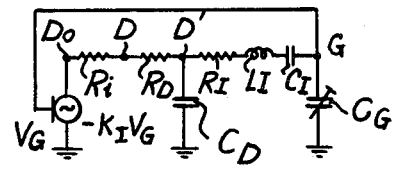
FIG. 3 is an equivalent circuit diagram of the oscillator circuit depicted in FIG. 2.

Reference is now made to FIG. 3, wherein an equivalent representation of the quartz crystal oscillator circuit, depicted in FIG. 2, is illustrated. The C-MOS inverter, comprised of transistors $Tr_p$ and $Tr_N$ are represented as a voltage source having a gain $K_i$ and an internal impedance $R_i$. The equivalent resistor $R_I$, equivalent inductor $L_I$ and equivalent capacitor $C_I$ represent the equivalent resistance, inductance capacitance, respectively, defined by the quartz crystal vibrator X. Accordingly, the shape of the signals produced at the respective terminals of the circuit are as follows: A sine wave is produced at node G, a square wave is produced at node $D_O$ and an RC discharge signal is produced at node D. A phase difference of $-90°$ is defined between nodes G and D' by the resonating circuit formed by the quartz crystal vibrator, gate capacitor $C_G$ and drain capacitor $C_D$, as depicted in FIG. 3. The phase difference between node G, which node represents the gate input terminal of the C-MOS inverter, and the node $D_O$ of the C-MOS inverter is $-180°$. Accordingly, in order to insure that the phase difference around the loop is $-360°$, a fundamental requirement, if stable oscillation is to be obtained, the phase difference between the nodes $D_O$ and D', as a result of the impedance $R_i$ of the voltage source, and the resistance $R_D$, is $-90°$.

Figure 4:
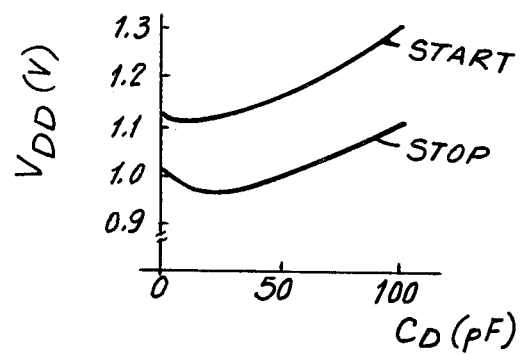
FIG. 4 is an illustration of the manner in which the oscillation of the oscillator circuit, depicted in FIG. 2, varies as a result of changes in the supply voltage and drain output capacitance.
Figure 5:
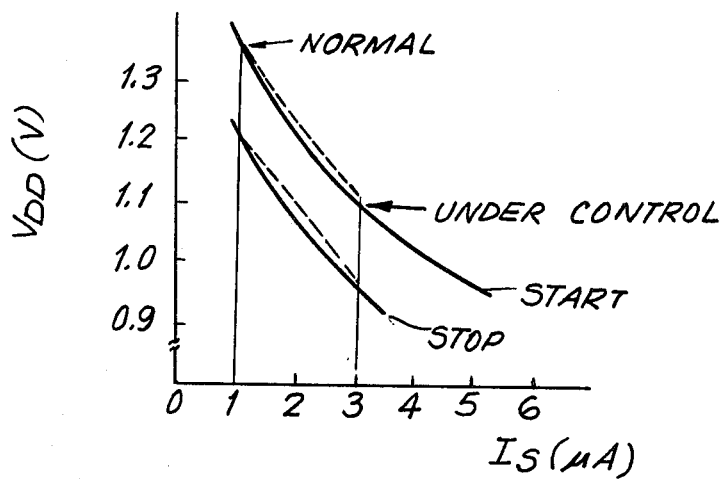
FIG. 5 is an illustration of the manner in which the oscillation of the oscillator circuit, depicted in FIG. 2, varies as a result of changes in the supply voltage and current supplied thereto.

It is noted that the closed loop gain of the equivalent circuit in FIG. 3 can be less than, or greater than, one, and will not effect the boundary operating parameters of the oscillator circuit. Specifically, the starting voltage and stopping voltage respectively represent the value of the supply voltage at which the oscillator circuit will begin oscillating when a supply voltage is initially applied thereto, and a decreased level of the supply voltage that will cause the oscillator circuit to turn off or stop oscillating. Accordingly, if the gate capacitor $C_G$, the drain capacitor $C_D$ and the resistor $R_D$ are large, the starting voltage and stopping voltage will likewise be elevated. Comparison of the relationship between the voltages at which oscillation starts and stops, as $C_D$ varies, is depicted in FIG. 4. The differences between the levels of the starting and stopping voltages, as the drain capacitance is varied, results in part from the fact that at the time that the oscillator begins to oscillate, the internal resistance $R_i$ and gain $K_i$ of the equivalent voltage source has a small amplitude resulting from white noise that is present, whereas as at the time of stopping, the internal impedance $R_i$ and the gain $K_i$ are of a larger amplitude. It follows that the potential at node G before oscillation begins is about $-V_{DD}/2$ when the threshold values of the P-channel and N-channel transistors are equal. Accordingly, as a result of the characteristics of the P-channel and N- channel MOS transistors, the threshold voltages have a considerable influence on the point at which the oscillator circuit will initially begin to oscillate. Stated otherwise, when the source voltage approximates the sum of the threshold value voltages of both the P-channel and N-channel transistors, the closed loop gain of the inverter approximates unity, and the gain $K_i$ and resistance $R_i$ are suddenly changed as a result thereof. It is noted, however, that the output impedance $R_i$ of the C-MOS inverter is influenced in large measure by the threshold voltages of both the P-channel and N-channel transistors, the variations in the supply voltage applied to the oscillator circuit and the fluctuations in the voltage-current converting coefficient. Moreover, the output impedance $R_i$ of the C-MOS inverter is, in large measure, dependent upon the supply current $I_S$ and the relationship between the supply current $I_S$ and the manner in which same are effected by changes in the supply voltage is illustrated in FIG. 5.

In light of the foregoing description, it is apparent that the oscillator circuit will begin oscillating at lower starting and stopping voltages if the drain output capacitance $C_D$ is decreased or supply current $I_S$, is increased. Nevertheless, the drain output capacitance $C_D$ cannot be substantially decreased since the stability of the oscillating circuit and, hence, of the high frequency signal produced thereby will be decreased as a result of changes in the level of the supply voltage applied thereto. Alternatively, if the supply current $I_S$ is increased, a likewise increase in current consumption will result, thereby shortening the life of the voltage supply and, hence, providing an otherwise unacceptable result. Additionally, because the oscillator circuit utilizes a large number of analog elements, when compared with the remaining digital circuitry of an electronic wristwatch, the oscillator circuit is particularly sensitive to variations resulting from the fabrication of the IC chip. It is therefore a further requirement in selecting an oscillator circuit design to take into account the stability of oscillation as the IC chip is enlarged or the scale of same is changed such as in LSI chips manufactured for a digital wristwatch. Moreover, in electronic wristwatches utilizing a quartz crystal vibrator as a time standard, in a preferred embodiment, the electrical circuits integrated into the IC chip must be capable of operating at a supply voltage in the range of 1.1 V to 1.2 V considering the temperature characteristics of the components and the internal resistance of the battery utilized as the source of the supply voltage for operating the timepiece circuitry. For the reasons noted above, when LSI circuitry is designed for use in electronic wristwatches, considerations involving the level of the supply voltage required to obtain starting and prevent stopping of the oscillator circuit were given secondary consideration, thereby resulting in an attendant increase in the current consumed by the oscillator circuit, when compared with the remaining circuits in the electronic wristwatch. Accordingly, as is detailed below, the instant invention is particularly directed to increasing the closed loop gain of the oscillator circuit during starting, or at times when stopping is likely to result from a decrease in the supply voltage, to improve the relationship between the oscillating frequency of the oscillator circuit and the supply voltage utilized to drive same.

Figure 6:
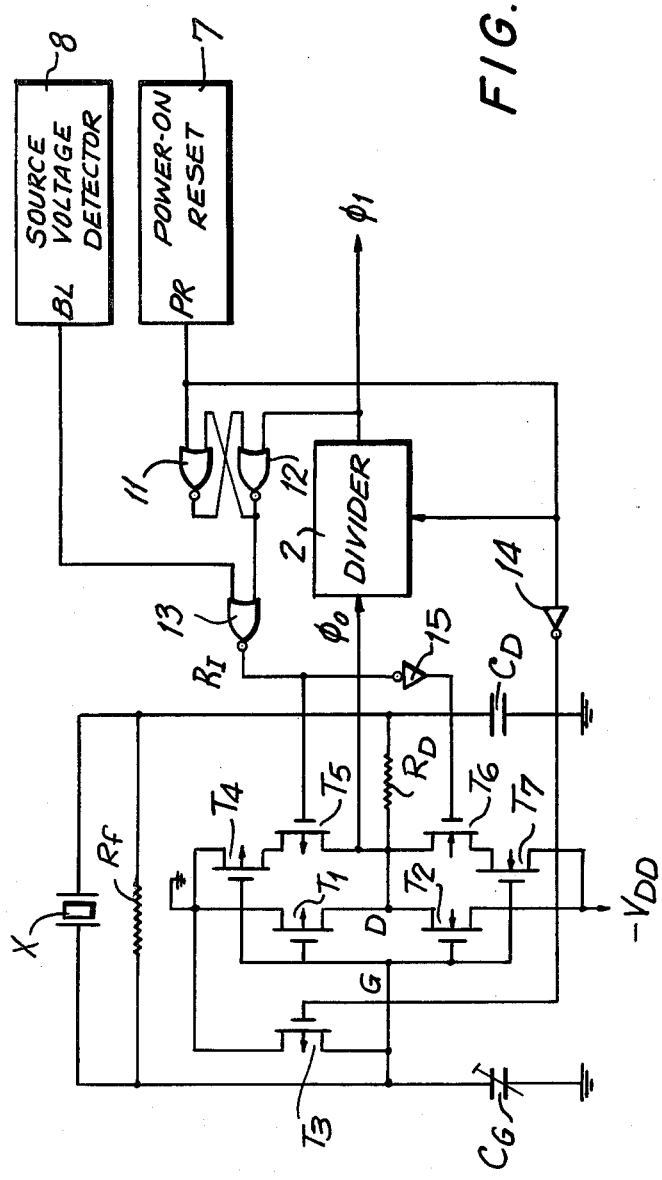
FIG. 6 is a circuit diagram of a quartz crystal oscillator circuit constructed in accordance with a preferred embodiment of the instant invention.
Figure 7:
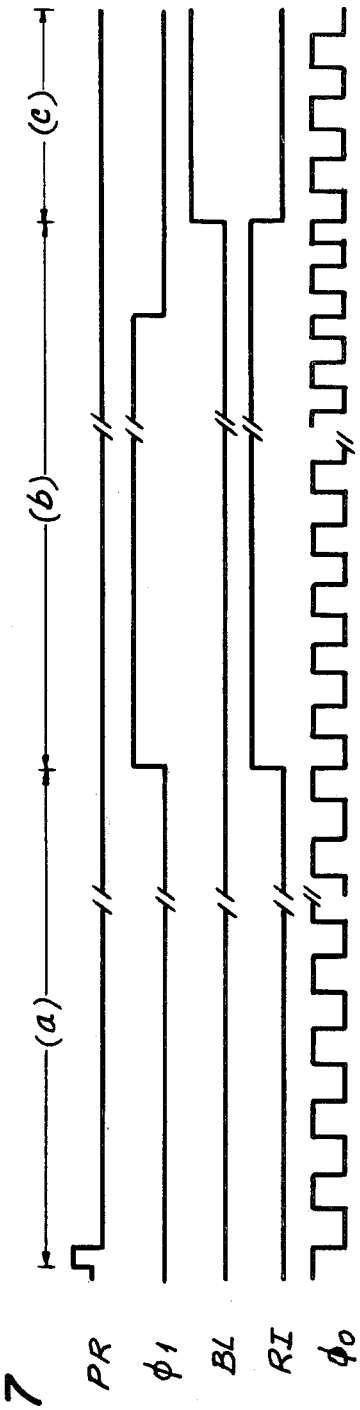
FIG. 7 is a wave diagram illustrating the operation of the quartz crystal oscillator circuit depicted in FIG. 6.

Reference is now made to FIG. 6, wherein an oscillator circuit constructed in accordance with the preferred embodiment of the instant invention is depicted, like reference numerals and reference letters being utilized to denote like elements described above. The oscillator circuit includes the feedback resistor $R_F$, the quartz crystal vibrator X, the drain resistor $R_D$, of C-MOS inverter comprised of P-channel MOS transistor $T_1$ and an N-channel transistor $T_2$, a drain capacitor $C_D$, and a gate capacitor $C_G$, each of the elements utilized in a conventional oscillator circuit of the type depicted in FIG. 2. Coupled in parallel with the C-MOS inverter comprised of transistors $T_1$ and $T_2$ is a secondary circuit comprised of P-channel transistors $T_4$ and $T_5$ and N-channel transistors $T_6$ and $T_7$. As is explained in detail below, analog transistors $T_4$ through $T_7$ are adapted to selectively raise the equivalent closed loop gain of the oscillator circuit. It is noted that the polarity of the transistors $T_4$ through $T_7$ can also be reversed. The manner in which the secondary amplifier is adapted to selectively elevate the closed loop gain of the oscillator circuit is described in detail with respect to the operation of the circuit, with reference being made to the wave diagrams illustrated in FIG. 7.

For example, when power is to be initially supplied to the oscillator circuit, it is desired that the voltage required to start the oscillator circuit oscillating be lowered. Accordingly, a power-on reset circuit 7 is actuated when the voltage supply $V_{DD}$ is turned on to produce a power-on reset signal PR. It is noted that the power-on reset signal is provided as an initial pulse for starting the oscillator circuit. Specifically, in addition to being applied to a set input of a set-reset flip-flop comprised of NOR gates 11 and 12, the pulse of the power-on reset signal is applied through an inverter 14 to the gate electrode of MOS transistor $T_3$ to thereby turn same ON and thereby elevate the gate input terminal G of the inverter to a ground potential, which ground potential is positively referenced with respect to the negatively referenced voltage supply $V_{DD}$. Accordingly, the turning OFF of the transistor $T_3$ when pulse PR goes low applies an oscillating energy on the order of 1/Q to the oscillator circuit where Q is the quality factor of the oscillator circuit.

Also, in response to the set-reset flip-flop comprised of NOR gates 11 and 12 being set, LOW level output signal $R_I$ is produced at the output of NOR gate 13, which signal is directly supplied to the gate electrode of secondary amplifier transistor $T_5$ and through inverter 15 to the gate electrode of secondary amplifier transistor $T_6$. Accordingly, the HIGH level signal applied to the gate electrodes of transistor $T_6$, and the LOW level signal applied to transistor $T_5$, thereby dispose a secondary inverter comprised of transistors $T_7$ and $T_4$ in parallel with the C-MOS inverter, comprised of transistors $T_1$ and $T_2$. Once the secondary inverter is rendered operative by the application of a LOW level signal to transistor $T_5$, the output impedance of the main inverter comprised of transistors $T_1$ and $T_2$ is reduced, thereby increasing the closed loop gain of the amplifier circuit. The output impedance is lowered and the oscillator circuit begins oscillating and applies to a divider circuit 2 a high frequency time standard signal $\phi_0$.

The duration of time that the secondary inverter is disposed in parallel with the main inverter is determined by the divider circuit 2. Specifically, at a predetermined interval of time after the oscillator circuit begins oscillating, the output signal of the divider $\phi_1$ will change state, and thereby apply a reset signal to NOR gate 12 and, hence, reset the set-reset flip-flop. In response to the set-reset flip-flop being reset, the output signal produced by the NOR gate 13 returns to a HIGH level signal, thereby resulting in a HIGH level signal being applied to the gate electrode of transistors $T_5$ and a LOW level signal being applied to the gate electrodes of transistor $T_6$, to thereby turn OFF the secondary inverter. Accordingly, during the interval a, the secondary inverter is disposed in parallel with the main inverter, to thereby lower the impedance seen at the output thereof, and hence elevate the closed loop gain of the oscillator circuit, to thereby permit the oscillator circuit to begin oscillating at a lower supply voltage. However, once the output signal $\phi_1$ is produced by the divider circuit, the oscillator is returned to its predetermined closed loop gain, determined by the main inverter, during the interval b, which interval represents the usual operation of the oscillator.

Thereafter, the oscillator circuit is permitted to operate in its usual manner (interval b) until there is a substantial decrease in the supply voltage supplied to the oscillator circuit. The reduction in the supply voltage can result from a sudden drain on the battery, such as that caused by the energizing of a digital display comprised of light emitting diodes, or the operation of any other functional apparatus in a timepiece requiring an excess amount of current to operate same. To this end, a voltage detection circuit 8 is provided for detecting when supply voltage is lowered, in order to prevent the oscillator circuit from stopping as a result thereof.

Specifically, when the voltage detection circuit 8 detects a drop in the supply voltage, a HIGH level signal is applied to NOR gate 13, to thereby produce a LOW level output $R_I$, which output once again turns on the secondary inverter circuit in the manner discussed above to thereby reduce the output impedance of the main inverter, and hence increase the closed loop gain of the oscillator circuit. As illustrated in FIG. 4, by increasing the closed loop gain, the magnitude of the supply voltage needed to continue operating the oscillator circuit and thereby prevent same from stopping is reduced. Accordingly, for the interval of time c that the magnitude of the supply voltage, utilized to drive the oscillator circuit is reduced, the gain of the oscillator circuit will be increased.

It is noted that when the output impedance, seen by the inverter circuit is reduced, the oscillating frequency of the oscillator circuit will be slightly increased, and thereby effect a compensation of the usual reduction in the oscillating frequency resulting from a lowering of the supply voltage applied to the oscillator circuit. Moreover, the signal BL produced by the voltage detection circuit could be a signal produced as a result of operating certain of the secondary function circuits of the timepiece. For example, when an LED display is energized, a current that is greater by $10^3$ than that required to normally operate the timepiece, is consumed, thereby providing an abrupt change in the supply voltage delivered by the battery. Accordingly, a voltage detection circuit of the type to which the instant invention is directed, will prevent the oscillator circuit from stopping when the LED display is energized. By preventing the oscillator from stopping, more precise and accurate timekeeping is effected thereby.

It is noted that the power-on reset circuit, depicted in FIG. 6, can be provided with a manually operated switch for preventing the dissipation of the battery's capacity during storage and handling. Specifically, in an electronic wristwatch, the oscillator circuit is usually permitted to operate from the time that the timepiece is manufactured until it is delivered to the consumer. However, if the transistor $T_3$ is turned ON during shipping and handling, and thereby connects the gate input terminals of $T_1$ and $T_2$ to ground, a considerable reduction in the battery's capacity will have been avoided. Moreover, if the time correction switch were utilized to produce the power-on signal, an additional switch would not be needed in the electronic wristwatch.

Figure 8:
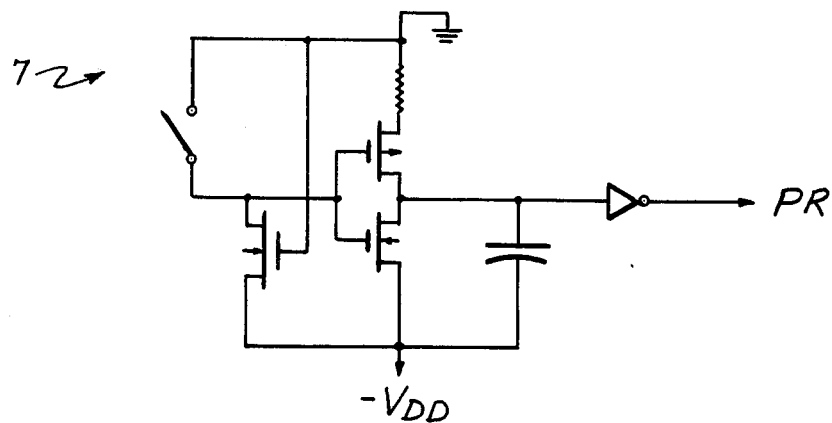
FIG. 8 is a detailed circuit diagram of the power-on reset circuit of the oscillator circuit illustrated in FIG. 6.
Figure 9:
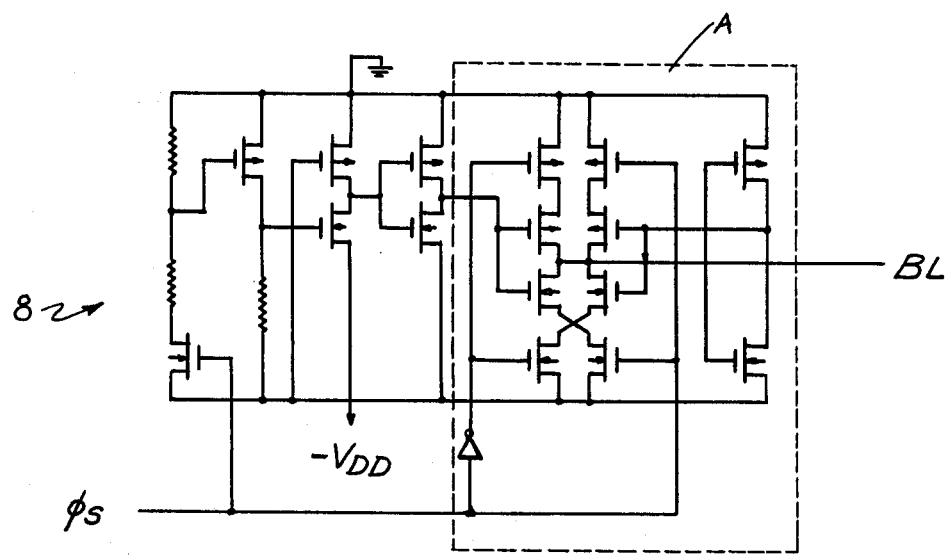
FIG. 9 is a detailed circuit diagram of the voltage detection circuit depicted in FIG. 6.

A detailed illustration of a power-on reset circuit 7, including a manually operated switch for controlling same, is depicted in FIG. 8, it being noted that same is well known in the art. Similarly, in FIG. 9, a detailed illustration of a voltage detection circuit, of the type well known in the art, that utilizes the ON resistance of the MOS transistors and varies same when the signal applied to the gate electrode nears the threshold voltage, is provided. It is noted that the voltage detection circuit is utilized with a latch circuit A for sampling the signal produced by the voltage detection circuit periodically in response to a clock signal $\phi_S$ applied thereto.

Accordingly, the instant invention permits the operation of the oscillator circuit to be more independent of variations likely to occur during manufacture, and to permit the oscillation of the oscillator circuit to be commenced at a lower supply voltage and to be continued in the event that the supply voltage is substantially decreased. Moreover, the above advantages are obtained with only a little increase in current consumption as a result thereof. It is noted that the invention is applicable to all quartz crystal watches and, moreover, can be utilized in oscillating circuits having a $L_iT_aO_3$ crystal as an oscillator or an oscillating circuit utilizing an integrated injection logic element, or the like.

It will thus be seen that the objects set forth above, among those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In an oscillator circuit including a vibrator and a first inverter means having an input terminal and an output terminal for producing a high frequency signal at the output terminal, the output terminal being fed back through the vibrator to the input terminal to define a predetermined closed loop gain, the improvement comprising control means for producing a control signal for a predetermined period of time after electrical supply power is applied to said oscillator circuit, means to temporarily disable said first inverter means while said supply power is being applied whereby initial oscillations are delayed, and secondary inverter means adapted to be selectively coupled in parallel with the first inverter means during said predetermined period of time that the control signal is applied thereto to thereby reduce the impedance at the output terminal of the first inverter means and thereby increase the closed loop gain of the oscillator circuit during said predetermined period of time, said predetermined period of time being of fixed duration and determined by delay means, said delay means being reset to initiate a new time period simultaneously with the application of said supply power, the delayed output of said delay means resetting said control signal to uncouple said secondary inverter means.

2. An oscillator circuit as claimed in claim 1, wherein said first inverter means is a C-MOS inverter defining a drain output terminal and gate input terminal, said drain output terminal being fed back through said vibrator to said gate input terminal.

3. An oscillator circuit as claimed in claim 2, wherein said secondary inverter means includes a C-MOS pair of transistors coupled in parallel with said C-MOS transistors comprising said first inverter means.

4. An oscillator circuit as claimed in claim 3, wherein said secondary inverter means includes control transistors coupled in series with said C-MOS pair of transistors, said control transistors being coupled to said control means, for receiving said control signal, and in response thereto disposing said transistors of said C-MOS pair of transistors of said secondary inverter means in parallel with said C-MOS transistors defining said first inverter means, to thereby reduce the impedance at the output terminal of said first inverter means.

5. An oscillator circuit as claimed in claim 4, wherein stabilizing impedance means are coupled intermediate said drain output terminal and a reference potential and further impedance means are coupled intermediate said gate input terminal and a reference potential, and feedback resistance means are coupled in parallel with said vibrator, to thereby stabilize the operation of said oscillator circuit means.

6. An oscillator circuit as claimed in claim 2, and including voltage supply means for applying said supply voltage across the parallel connection of said first inverter means and said secondary inverter means to thereby energize same.

7. An oscillator circuit as claimed in claim 6, wherein said control means includes a power-on reset circuit means for producing a control signal in response to said supply voltage being initially applied across at least said first inverter means and a secondary pulse in response to said supply voltage being initially applied, and a control transistor connected intermediate said reference potential and said gate input terminal for receiving said secondary control pulse and in response thereto for connecting said gate input terminal to said reference potential, said power-on reset means being further adapted to apply said control signal to said secondary inverter means to thereby dispose same in parallel with said first inverter means and reduce the output impedance thereat.

8. An oscillator circuit as claimed in claim 1, wherein said delay means is a frequency divider circuit in an electronic wristwatch, said frequency divider circuit being reset by said electrical supply power application.

9. An oscillator circuit as claimed in claim 1, and further including voltage detection circuit means for detecting a drop in the supply voltage applied to said first inverter means during oscillation, said voltage detection circuit means being adapted, in response to detecting said drop in voltage, to apply said control signal for connecting said secondary inverter means for a period of time that is determined by said voltage detection means.

10. An oscillator circuit as claimed in claim 1, wherein said first inverter means is a complementary coupled pair of C-MOS transistors, each having commonly coupled gate electrodes defining said input terminal and commonly coupled drain electrodes defining said output terminal, said secondary inverter means including at least one pair of C-MOS transistors, the gate electrode of said transistors being coupled to said gate input terminal and the drain electrode being adapted to be selectively coupled by said control signal to said drain output terminal, to thereby decrease the impedance at said drain output terminal in response to said control signal being applied thereto.

11. In an oscillator circuit operating from a voltage supply means and including a vibrator and a first inverter means having an input terminal and an output terminal for producing a high frequency signal at the output terminal, the output terminal being fed back through the vibrator to the input terminal to define a predetermined closed loop gain, the improvement comprising control means for producing a control signal when the voltage from said supply means decreases to a predetermined value, and secondary inverter means adapted to be selectively coupled in parallel with the first inverter means during the period of time that the control signal is applied thereto to thereby reduce the impedance at the output terminal of the first inverter means and thereby increase the closed loop gain of the oscillator circuit.

12. The oscillator circuit of claim 11, wherein said control signal is continuous during the time period of decreased voltage from said supply means.

13. The oscillator circuit of claim 12, wherein said secondary inverter means are uncoupled and said output impedance increases when the value of said supply means voltage is raised from said decreased value.

14. An oscillator circuit as claimed in claim 11, wherein said first inverter means is a C-MOS inverter defining drain output terminal and gate input terminal, said drain output terminal being fed back through said vibrator to said gate input terminal.

15. An oscillator circuit as claimed in claim 14, wherein said secondary inverter means includes a C-MOS pair of transistors coupled in parallel with said C-MOS transistors comprising said first inverter means.

16. An oscillator circuit as claimed in claim 15, wherein said secondary inverter means includes control transistors coupled in series with said C-MOS pair of transistors, said control transistors being coupled to said control means, for receiving said control signal, and in response thereto disposing said transistors of said C-MOS pair of transistors of said secondary inverter means in parallel with said C-MOS transistors defining said first inverter means, to thereby reduce the impedance at the output terminal of said first inverter means.

17. An oscillator circuit as claimed in claim 11, wherein said first inverter means is a complementary coupled pair of C-MOS transistors, each having commonly coupled gate electrodes defining said input terminal and commonly coupled drain electrodes defining said output terminal, said secondary inverter means including at least one pair of C-MOS transistors, the gate electrode of said transistors being coupled to said gate input terminal and the drain electrode being adapted to be selectively coupled to said drain output terminal in response to said control signal, to thereby decrease the impedance at said drain output terminal in response to said control signal being applied thereto.

* * * * *